(12) United States Patent
Biber et al.

(10) Patent No.: US 11,500,051 B2
(45) Date of Patent: Nov. 15, 2022

(54) DEVICE AND METHOD FOR PATIENT-SPECIFIC INTERFERENCE SUPPRESSION

(71) Applicant: Siemens Healthcare GmbH, Erlangen (DE)

(72) Inventors: Stephan Biber, Erlangen (DE); Jürgen Nistler, Erlangen (DE); Rainer Schneider, Erlangen (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/223,333

(22) Filed: Apr. 6, 2021

(65) Prior Publication Data

US 2021/0325494 A1  Oct. 21, 2021

(30) Foreign Application Priority Data

Apr. 21, 2020  (DE) ...................... 10 2020 205 037.6

(51) Int. Cl.
| | |
|---|---|
| *G01R 33/3875* | (2006.01) |
| *G01R 33/56* | (2006.01) |
| *G01R 33/54* | (2006.01) |
| *G01R 33/422* | (2006.01) |

(52) U.S. Cl.
CPC ....... *G01R 33/3875* (2013.01); *G01R 33/422* (2013.01); *G01R 33/543* (2013.01); *G01R 33/546* (2013.01); *G01R 33/5607* (2013.01)

(58) Field of Classification Search
CPC .............. G01R 33/3875; G01R 33/422; G01R 33/543; G01R 33/546; G01R 33/5607
See application file for complete search history.

(56) References Cited

U.S. PATENT DOCUMENTS

| | | |
|---|---|---|
| 2005/0264288 A1 | 12/2005 | Campagna et al. |
| 2014/0128724 A1 | 5/2014 | Dahan et al. |
| 2015/0268321 A1* | 9/2015 | Zhai ................ G01R 33/288 324/309 |
| 2016/0091588 A1* | 3/2016 | Benner .............. A61B 5/055 324/309 |
| 2020/0249292 A1 | 8/2020 | Biber |

FOREIGN PATENT DOCUMENTS

| | | |
|---|---|---|
| DE | 102005019859 A1 | 12/2005 |
| WO | 2019068687 A2 | 4/2019 |

OTHER PUBLICATIONS

German Office Action for German Application No. 10 2020 205 037.6 dated Feb. 12, 2021.

* cited by examiner

*Primary Examiner* — Rishi R Patel
(74) *Attorney, Agent, or Firm* — Lempia Summerfield Katz LLC

(57) ABSTRACT

A magnetic resonance tomography system has an interference suppression transmitter and an interference suppression antenna. The interference suppression transmitter is configured to output an interference suppression signal via the interference suppression antenna as a function of a transmission interference suppression parameter determined from a patient property. In a predetermined region of an environment of the magnetic resonance tomography system, a field strength of the excitation pulse is reduced by destructive interference.

13 Claims, 3 Drawing Sheets

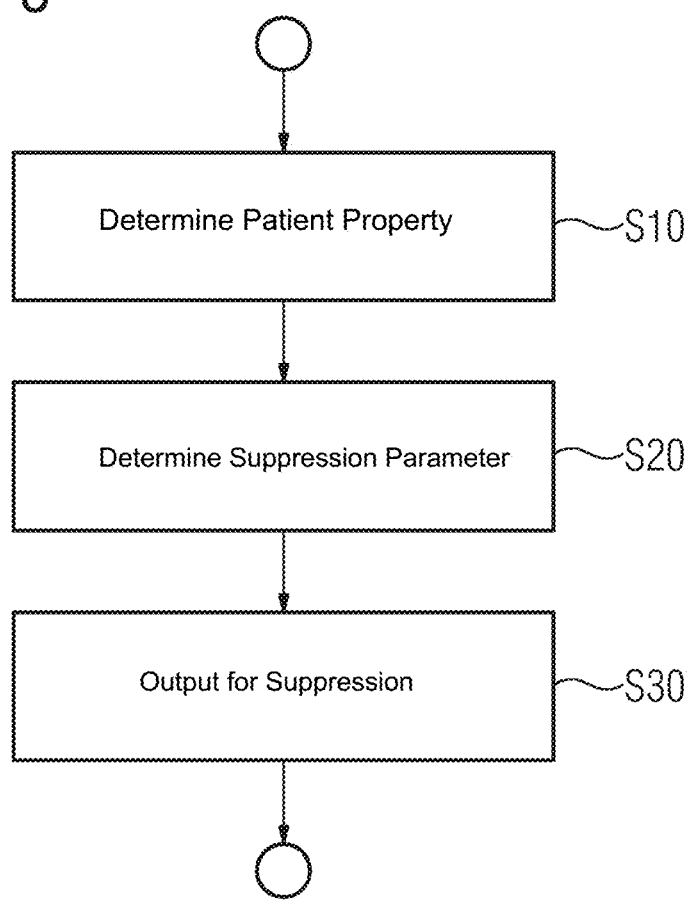

DEVICE AND METHOD FOR PATIENT-SPECIFIC INTERFERENCE SUPPRESSION

RELATED CASE

This application claims the benefit of German Application 10 2020 205 037.6, filed on Apr. 21, 2020, which is hereby incorporated by reference in its entirety.

FIELD

The present embodiments relate to a device for active interference suppression in a magnetic resonance tomography system and to a method for operation of the magnetic resonance tomography system.

BACKGROUND

Magnetic resonance tomography systems are imaging devices, which, for mapping an examination object, orient nuclear spins of the examination object with a strong external magnetic field and by way of a magnetic alternating field excite them for precession about this orientation. The precession or return of the spins from this excited state into a state with less energy in turn generates a responsive magnetic alternating field, which is received via antennas.

With the aid of magnetic gradient fields, a spatial encoding is impressed onto the signals, and this subsequently enables an allocation of the received signal to a volume element. The received signal is then evaluated, and a three-dimensional imaging representation of the examination object is provided. For reception of the signal, preferably local receive antennas, what are known as local coils, are used, which, in order to achieve a better signal-to-noise ratio, are arranged directly on the examination object. The receive antennas can also be installed in a patient couch or bed.

Magnetic resonance tomography systems require radio frequency shielding. For excitation of the nuclear spins, radio frequency pulses with powers in the kilowatt range are generated and are absorbed only partially in the patient. Radio waves, which leave the patient feed-through, are emitted into the space and must be shielded in order to adhere to emission limits.

For this reason, expensive shielding cabins are installed around a magnetic resonance tomography system in order to reduce both emissions and immissions.

From the patent application WO 2019068687 A2, a method is known for reducing emissions by destructive interference. The conditions change between examinations, however, or even during the length of an individual examination.

SUMMARY AND DETAILED DESCRIPTION

It is an object to reduce emissions of the magnetic resonance tomography system during image capture.

The object is achieved by a magnetic resonance tomography system of the embodiments. A method is provided for operation of the magnetic resonance tomography system.

The magnetic resonance tomography system has an interference suppression transmitter and an interference suppression antenna, which can be actuated for emission by the interference suppression transmitter with a radio frequency signal. The interference suppression antenna is arranged at a distance from the patient tunnel. The interference suppression antenna or also a plurality of interference suppression antennas is arranged outside of the patient tunnel, for example at the opening or around it. An arrangement at a greater distance, for example equal to or greater than a quarter of, a half of or the whole wavelength of a radio wave with Larmor frequency in the open air, is also conceivable. The symmetry of the wave issuing from the patient tunnel increases as the distance increases, and this simplifies determining an interference suppression signal to be emitted via the transmit antenna or antennas for negative interference.

The interference suppression transmitter is configured to provide an appropriate interference suppression signal in a frequency range of an excitation pulse of the magnetic resonance tomography system in a manner predetermined by a controller.

The controller is configured to determine the frequency, amplitude and phase of the interference suppression signal to be emitted such that in a predetermined region of an environment of the magnetic resonance tomography system a field strength of the excitation pulse is reduced by destructive interference. Various possibilities for determining will be described below. The transmission interference suppression parameter is determined as a function of a property of the patient, in particular a physical property. In particular, all properties of the patient that influence the propagation of an electromagnetic signal from the patient tunnel into an environment of the magnetic resonance tomography system are regarded as a property of the patient.

The method is provided for operation of the magnetic resonance tomography system. The method has the act of detecting a physical property of the patient by way of the magnetic resonance tomography system. The physical property can include, for example, weight, height, body shape and or relative position to the magnetic resonance tomography system. Detecting can take place by way of a magnetic resonance tomography system by a scan, which can also be accelerated by an appropriate sequence, for example by a reduced resolution or dimensionality. Dedicated sensors of the magnetic resonance tomography system, such as, for example pressure mats, optical sensors like a camera or light barriers, are also conceivable, however. The magnetic resonance tomography system can also detect the physical parameter via an interface by data exchange with a database or input by an operator.

In an embodiment, detecting can also detect a course over time of the property. It is conceivable, therefore to detect by way of a plurality of detections by sensors or the magnetic resonance tomography system itself at different instants a course of the property at different instants by way of interpolation in order to be able to indicate the property also at instants by way of interpolation if this is, for example, not directly possible without interfering with image capture. A property that changes over time is, for example, the position, which changes due to breathing, heartbeat or movement of the couch and may be predicted for any instants by detecting the speed and/or period.

In a further act of the method, the control unit determines a transmission interference suppression parameter as a function of the detected physical property. For example, a field strength of the excitation pulse at the location of the interference suppression antenna can be determined on the basis of the physiognomy and relative location by simulation of the propagation behavior by means of Maxwell's equations. An interference suppression signal to be emitted by the interference suppression antenna in order to achieve destructive interference with simultaneous output of the interference suppression signal and the excitation pulse is used. In a predetermined region of an environment of the magnetic resonance tomography system, a field strength of the excitation pulse is reduced. Parameterized models or tables are also conceivable that are determined by measurements and/or algorithms with artificial intelligence, which are trained by example measurements and/or databases. The transmission interference suppression parameter is a parameter, which influences or changes the interference suppression signal to be emitted by the interference suppression antenna, for example in frequency, amplitude, phase and/or spectral distribution, also so as to vary over the course over time. A plurality of transmission parameters, which are determined and influence the interference suppression signal to be emitted in different ways, is also conceivable.

In another act, the control unit causes simultaneous emitting of the excitation pulse and the interference suppression signal for interference suppression via the interference suppression transmitter and the interference suppression antenna. Simultaneous is regarded as a synchronization of excitation pulse and interference suppression signal, which synchronization defines the phases of excitation pulse and interference suppression signal in a predetermined relationship to each other with deviations of less than 20%, 10% or 5% of the oscillation period of the Larmor frequency of the magnetic resonance tomography system for the nuclear magnetic spins to be examined.

A plurality of interference suppression signals simultaneously similarly synchronized via different interference suppression antennas is also conceivable.

Advantageously, determining the interference suppression signal to be emitted for the interference suppression as a function of the patient, enables the interference suppression to adjust to changes due to the patient and thus ensure adherence to the emission limit values at all times.

In one conceivable embodiment of the magnetic resonance tomography system, the magnetic resonance tomography system has a sensor. The sensor is configured to detect one or more properties of the patient. The properties can be, for example, position, weight, height or body shape. Preferably, the position is a position specified by a patient couch. The sensor can detect the properties for example optically, as a camera or light barrier, potentially also three-dimensionally by way of a combination of cameras or by using light patterns. Mechanical sensors such as pressure mats or the like are also conceivable as capable of determining physiological properties of the patient. The patient couch can be a sensor, which detects the position of the patient couch along the z-axis, for example a pulley with rotary encoder, an optically or a mechanically scanned length scale or act counter or angle transmitter on displacement units or their motors.

Advantageously, dedicated sensors can accelerate detecting of physiological properties of the patient.

In one possible embodiment of the magnetic resonance tomography system, the magnetic resonance tomography system has an interface in order to receive information about a property of the patient. The interface can be an electrical interface to a different system in which, for example, information relating to the patient is stored or provided by combination or evaluation. Network interfaces such as Ethernet or WLAN or local interfaces such as USB, I2C or CANbus, for example, are conceivable. They can also be operating interfaces for human operators, however, via which inputs relating to the patient take place.

Advantageously, known information about the patient can be used by the interface for the method.

In one conceivable embodiment of the magnetic resonance tomography system, the magnetic resonance tomography system is configured to detect the property of the patient itself. In particular, this should be taken to mean that the magnetic resonance tomography system acquires the physiological property of the patient by way of a magnetic resonance scan. The scan can be accelerated, for example, by lower resolution or dimensionality. It is also conceivable for a scan or individual sections of the scan to be interlaced or to take place in an interleave method for detection of a property of the patient between sequences or individual gradient pulses of an image capture sequence. In this way, real-time detection of changes and adjustment of the interference suppression is possible.

Advantageously, it is possible for the magnetic resonance tomography system itself, by way of a preferably fast magnetic resonance scan, to detect the property of the patient for determining the interference suppression parameter without further devices.

In one possible embodiment of the magnetic resonance tomography system, the interference suppression transmitter is configured to generate the interference suppression signals for the interference suppression antenna or interference suppression antennas by phase shift and/or amplitude adjustment as a function of one or more transmission interference suppression parameter(s). For example, the controller could estimate the decoupling of the excitation pulse by the patient out of the patient tunnel on the basis of the height and location of the patient and determine by a parameterized approximation formula or tabular values an amplitude for the interference suppression signal, which amplitude is sufficient to cancel or attenuate the decoupled excitation pulse. This is also conceivable for the phase, which depends, in particular, on a relative distance of the interference suppression antenna from the patient.

Setting the amplitude and phase offers a simple possibility for optimizing interference suppression.

In one conceivable embodiment of the method, the act of detecting the physical property has an input by an operator at an operating interface of the magnetic resonance tomography system. This can be, for example, an input relating to height or relative position of the patient. The indication of the body part to be examined, which due to the positioning in the FoV also defines a position of the patient, is also conceivable.

As the controller detects the input of the operator relating to a physical property, it can advantageously determine an interference suppression parameter therefrom without separate measurements.

In one conceivable embodiment of the method, the act of detecting the physical property includes evaluating a system configuration. For example, physical properties of the patient such as location or mass of the patient are already defined by settings of the magnetic resonance tomography system for an image capture, or by the connected local coils, and the controller can determine the property by way of an evaluation of this configuration.

Advantageously, a double input or measurement can thus be dispensed with when detecting the property.

BRIEF DESCRIPTION OF THE DRAWINGS

The above-described properties, features and advantages and the manner in which they are achieved will become clearer and more comprehensible in connection with the following description of the exemplary embodiments, which will be explained in more detail in connection with the drawings.

In the drawings:

FIG. 3 shows a schematic representation of a flowchart of an embodiment of a method.

DETAILED DESCRIPTION OF THE PREFERRED EMBODIMENTS

Figure 1:
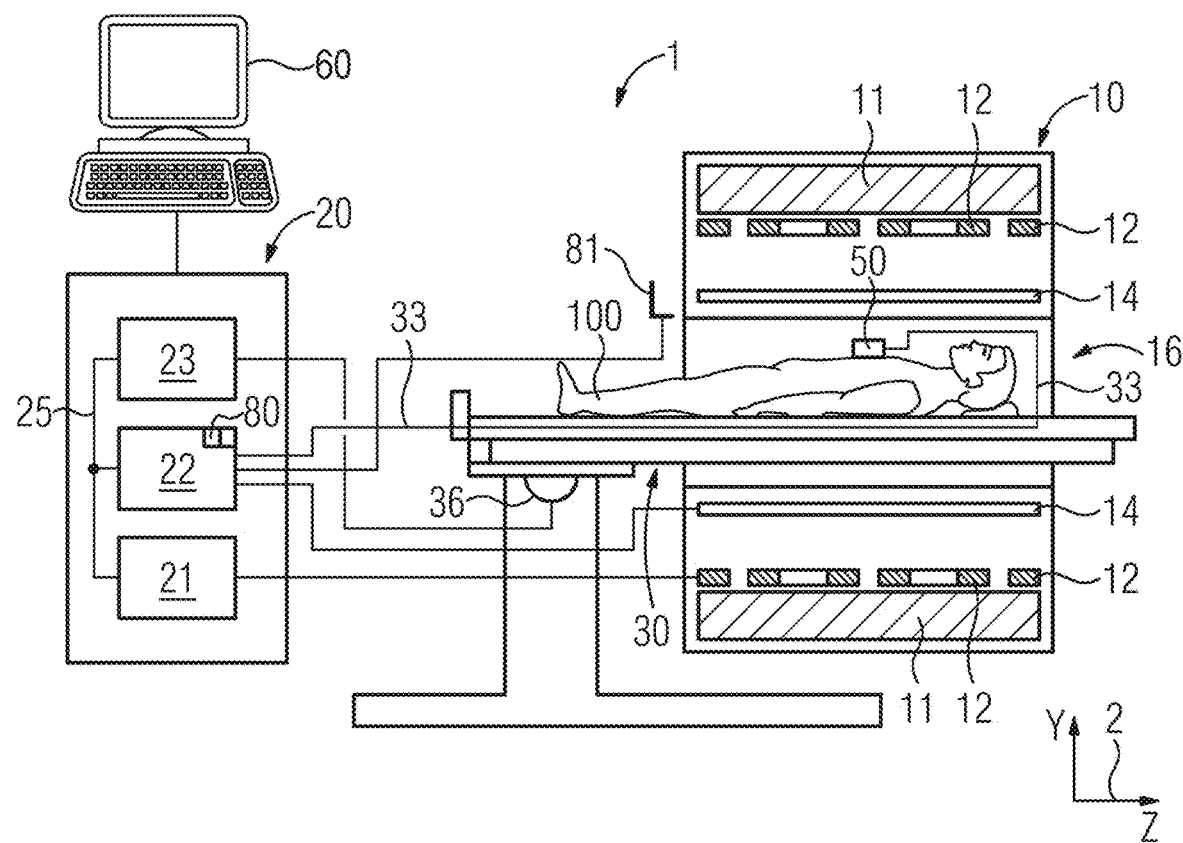
FIG. 1 shows a schematic representation of an embodiment of a magnetic resonance tomography system.

FIG. 1 shows a schematic representation of an embodiment of an magnetic resonance tomography system 1.

The magnetic unit or magnetic resonance scanner 10 has a field magnet 11, which generates a static magnetic field B0 for the orientation of nuclear spins of samples or of the patient 100 in an acquisition region. The acquisition region is characterized by an extremely homogeneous static magnetic field B0, wherein the homogeneity relates, in particular, to the magnetic field strength or the value. The acquisition region is almost spherical and arranged in a patient tunnel 16, which extends in a longitudinal direction 2 through the magnetic unit 10. A patient couch or bed 30 can be moved in the patient tunnel 16 by the displacement unit 36. Conventionally, the field magnet 11 is a superconducting magnet, which can provide magnetic fields with a magnetic flux density of up to 3T, even above this in the newest devices. For lower field strengths, permanent magnets or electromagnets with normal-conducting coils can also be used, however.

Furthermore, the magnetic unit 10 has gradient coils 12, which for spatial differentiation of the detected mapping regions in the examination volume are configured to overlay the magnetic field B0 with variable magnetic fields in three spatial directions. The gradient coils 12 are conventionally coils made from normal-conducting wires, which can generate fields in the examination volume that are orthogonal to each other.

The magnetic unit 10 also has a body coil 14, which is configured to emit a radio frequency signal supplied via a signal line into the examination volume and receive resonance signals emitted by the patient 100 and output them via a signal line.

A control unit or controller 20 supplies the magnetic unit 10 with the various signals for the gradient coils 12 and the body coil 14 and evaluates the received signals.

The control unit 20 thus has a gradient actuator 21, which is configured to supply the gradient coils 12 with variable currents via supply lines, which currents provide the desired gradient fields in the examination volume in a time-coordinated manner.

Furthermore, the control unit 20 has a radio frequency unit or radio frequency controller 22, which is configured to generate a radio frequency pulse with a specified course over time, amplitude and spectral power distribution for the excitation of a magnetic resonance of the nuclear spins in the patient 100. Pulse powers in the region of kilowatts can be achieved in the process. The excitation pulses can be emitted via the body coil 14 or also via a local transmit antenna into the patient 100.

A controller 23 communicates via a signal bus 25 with the gradient controller 21 and the radio frequency unit 22.

The controller 23 is in contact via a signal link with an operating interface 60, via which the magnetic resonance tomography system and the interference suppression controller 84 receives information about a physical property of the patient 100. This can be an operation terminal in the control room of the magnetic resonance tomography system, via which an operator directly makes an input relating to a physical property of the patient 100. A hospital information system is also conceivable, however, in which patient data is stored and/or the examinations are prepared or coordinated. The operating interface can be local or also be connected over a wide area network.

Arranged on the patient 100 is a local coil 50, which is connected via a connection line 33 to the radio frequency unit 22 and its receiver. It is also conceivable, however, that the body coil 14 serves as a receive antenna.

Arranged at an edge of the opening of the patient tunnel 16 are four interference suppression antennas 81, which are arranged on the corners of a square, which is inscribed on the circular opening, so the corners come to rest on the edge of the opening. The four interference suppression antennas 81 have a signal link to the interference suppression transmitter 80 of the radio frequency unit 22. The antennas 81 can be, for example, dipoles or crossed dipoles, which are also capacitively lengthened depending on the frequency.

Due to his finite conductivity, the patient 100 acts as the core of a coaxial cable whose sheath is the wall of the patient tunnel 16, and transmits a signal coupled into the body by the excitation pulse in the case of the legs or the head end into the environment. The interference suppression antenna or interference suppression antennas 81 in the vicinity of the opening can attenuate or suppress this field, for example, by emission of a suitable signal with opposite phase and the same amplitude value.

Figure 2:
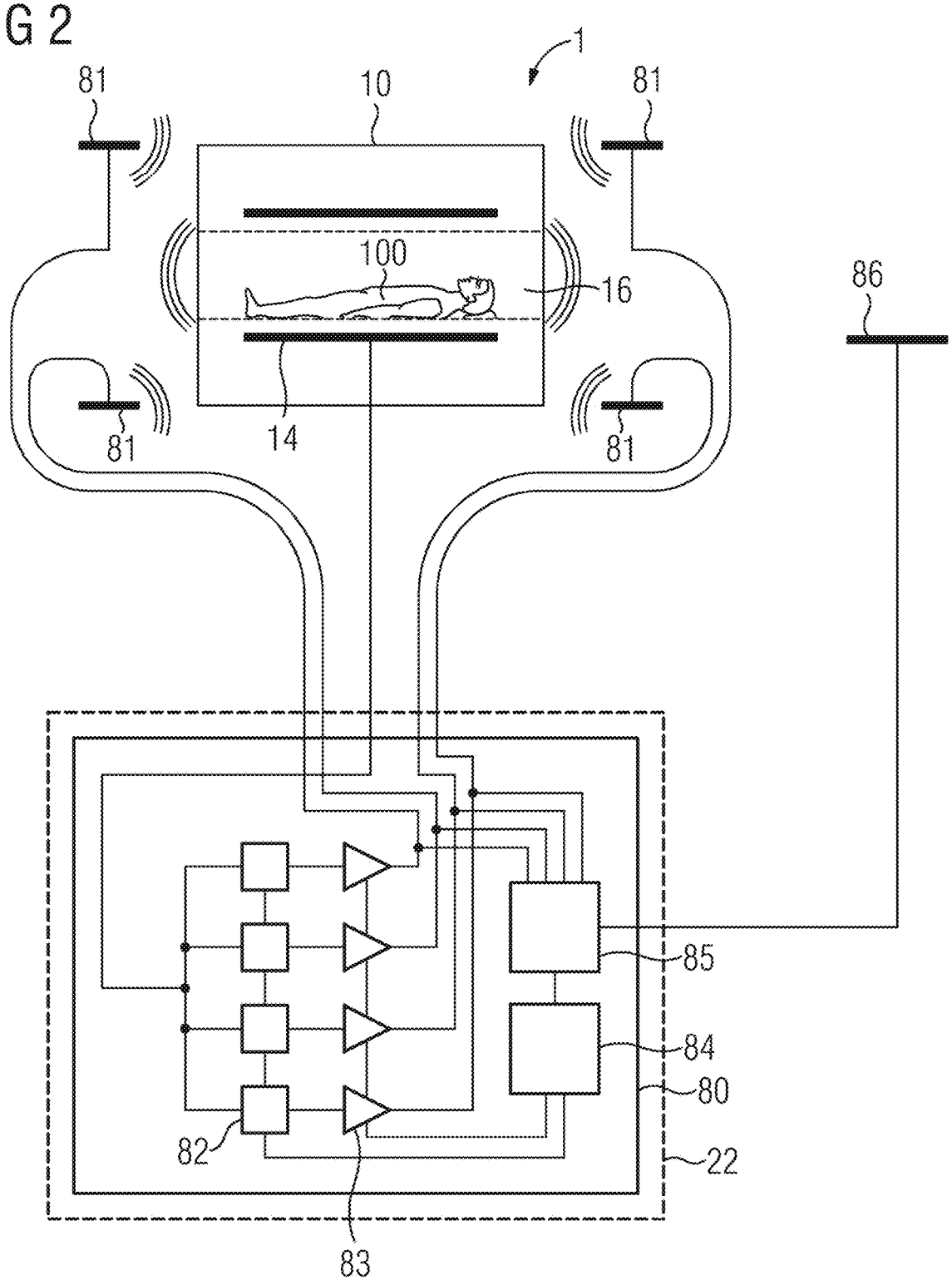
FIG. 2 shows the components involved in the method in an exemplary embodiment.

FIG. 2 shows once again in detail the components involved in an exemplary method. Identical reference numerals designate identical objects.

A reference signal derived from the excitation pulse for interference suppression is then delayed by settable phase shifters 82 for the individual interference suppression antennas 81 or shifted in phase and then amplified in amplitude by settable interference suppression transmitters 83 before the interference suppression is emitted via the interference suppression antennas 81.

The phase shifters 82 and the amplifiers 83 are set by an interference suppression controller 84 via a signal link. The interference suppression controller 84 determines the phase shifts and amplitudes as a function of an interference suppression parameter, which, in turn, depends on a physical property of the patient 100. It is thus conceivable, for example, that the amplitude of an excitation pulse decoupled into the environment increases with the length of the patient 100 because a greater part of the body projects out of the patient tunnel 16 during an examination and decouples the excitation pulse more strongly into the environment. Conversely it is conceivable that with a greater weight of the patient 100, the attenuation or absorption in the patient tunnel 16 is greater and the decoupling out of the patient tunnel 16 is reduced thereby. The position of the patient 100 relative to the patient tunnel 16 can in turn influence the amplitude for the reasons already described, but also change the phase of the decoupled signal due to different distances.

The magnetic resonance tomography system 1 can acquire the physical property for example by way of a magnetic resonance measurement. This can take place before the image capture intended by the operator. Preferably, this is interlaced time-wise with individual phases of the image capture, however, in other words, between individual excitation pulses or gradient pulses, or also between individual sequences. In this way, it is possible to adjust the transmission interference suppression parameter permanently and ensure adherence to the maximum emission values. This can be necessary, for example, if the patient 100 moves through the patient tunnel 16 on the patient couch 30 for imaging of the spine.

The physical parameter can also be, for example, the position of the patient 100 relative to the magnetic field unit 10, which changes with the displacement of the patient couch 30. The controller 23 can preferably communicate the relative position of the patient 100 to the interference suppression controller 84 via a signal link, so the controller 23 can determine the interference suppression parameter as a function thereof. The position of the couch 30 can be detected, for example, by the displacement unit using angle meters or step counters on the displacement unit 36 or also by mechanically or optically scannable scales along the couch 30. Cables with rotary encoders and/or position switches, which are activated by the patient couch depending on the position, are also conceivable.

It is also conceivable, however, that the magnetic resonance tomography system 1 has dedicated sensors, such as a camera, a pressure mat or light barriers, with which a physical property of the patient, such as location, weight or height, can be directly detected by the magnetic resonance tomography system 1 or the interference suppression controller 84 in order to determine the interference suppression parameter.

Finally, inputs at the operating interface 60 are also conceivable, with which a physical property of the patient can be directly or indirectly detected and be transmitted to the interference suppression controller for determining the interference suppression parameter.

FIG. 3 shows a schematic representation of a flowchart of a method.

The method is performed on an magnetic resonance tomography system that has an interference suppression transmitter 80 and an interference suppression antenna 81, which are configured to output an interference suppression signal in a frequency range of an excitation pulse of the magnetic resonance tomography system 1.

In an act S10, a property of the patient is detected by the magnetic resonance tomography system 1, wherein the property is a property, which directly or indirectly, that influences a propagation of an electromagnetic wave from the patient tunnel 16 if the patient 100 is at least partially located in the patient tunnel 16. Act S10 can include an input by an operator at an operating interface 60 of the magnetic resonance tomography system 1. The input can directly indicate a property of the patient 100, for example height, weight and/or gender. The property of the patient 100 can also be indirectly determined via the input, for example via a position, which the patient couch 30 with the patient 100 should approach. A position of the patient 100 relative to the patient tunnel 16 is simultaneously specified as a result.

The input of an examination to be carried out, for example for head, abdomen knee or foot, which then also again define position of the patient 100 relative to the patient tunnel 16, is also conceivable. The information relating to the examination and the properties of the patient 100 can also be retrieved by the magnetic resonance tomography system 1 from a hospital information system over a network, however, in which the examinations of the patient are planned and recorded.

It is also possible, however, for the magnetic resonance tomography system 1 or interference suppression controller 84 to detect the property of the patient 100 itself with dedicated sensors, such as, for example camera, light barriers, pressure mats or other mechanical and electronic sensors as already described.

Finally, the magnetic resonance tomography system 1 can also detect a property of the patient 100 by a magnetic resonance scan, however. This is preferably a magnetic resonance scan that differs from the actual imaging primarily by way of a shorter execution time, so it may be executed between imaging sequences or be interlaced in the sequences thereof, for example may be inserted between individual gradient pulses. The shorter execution time can be achieved, inter alia, by a lower resolution or a lower dimensionality, in other words one or two dimensional imaging instead of three dimensions.

It is also conceivable that in act 10, the property is detected not just instantaneously, but the development over time is also detected. Determining the properties at a plurality of instants makes it is possible to interpolate a development of the property over time and to predict the varying property for one instant at which detecting by way of the magnetic resonance tomography system or a sensor for example is not possible because this would interfere with the actual image capture or also requires too many resources of the magnetic resonance tomography system 1. For example, a linear or periodic movement, such as breathing, heartbeat or the movement of the patient couch 16, can be detected by two or three detection processes, which are spaced apart in time, and interpolated in between.

In act S20, the interference suppression controller 84 determines the transmission interference suppression parameter as a function of the detected physical property. The transmission interference suppression parameter is a parameter, which has an effect on amplitude, frequency and/or phase of the interference suppression signal. This can also be a plurality of transmission interference suppression parameters, for example in the case of a plurality of interference suppression antennas 81 and an interference suppression transmitter 80 with a plurality of channels. The interference suppression controller 84 determines the interference suppression signal such that, with simultaneous outputting of the interference suppression signal and the excitation pulse, in a predetermined region of an environment of the magnetic resonance tomography system 1, a field strength of the excitation pulse is reduced by destructive interference. This can be achieved, for example, by the transmission properties of the patient 100 being approximately determined or modelled for the excitation pulse with the detected physical property/properties of the patient 100. Approximation formulae determined by measurements can also be used here. The interference suppression controller 84 can calculate an amplification/attenuation and a phase shift thereby to be applied to the excitation pulse by the interference suppression transmitter 80 in order, on emission via the interference suppression antennas 81, to suppress the excitation pulse decoupled by the patient 100 out of the patient tunnel 16 at a predetermined location by destructive interference. With a plurality of interference suppression antennas 81, this can be achieved with a plurality of interference suppression parameters for a plurality of locations. It is also conceivable to achieve a suppression in the far field below a limit value by way of an optimization process.

In act S30, the magnetic resonance tomography system 1 finally simultaneously outputs the excitation pulse with the radio frequency unit 22 and the interference suppression pulse according to the determined transmission interference suppression parameters with the interference suppression transmitter 80 via the interference suppression antenna 81 or antennas. As envisaged in act S20, the pulses then mutually reduce or cancel out at particular locations or in the far field.

Although the invention has been illustrated and described in detail by the preferred exemplary embodiment, it is not limited by the disclosed examples and a person skilled in the art can derive other variations herefrom without departing from the scope of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A magnetic resonance tomography system comprising:
an interference suppression transmitter; and
an interference suppression antenna, wherein the interference suppression antenna is arranged at a distance from a patient tunnel, wherein the interference suppression transmitter is configured to output an interference suppression signal in a frequency range of an excitation pulse of the magnetic resonance tomography system via the interference suppression antenna as a function of a transmission interference suppression parameter, so in a predetermined region of an environment of the magnetic resonance tomography system a field strength of the excitation pulse is reduced by destructive interference, wherein the transmission interference suppression parameter is determined as a function of a property of a patient, the property comprising a weight, a height or a body shape of the patient.

2. The magnetic resonance tomography system as claimed in claim 1, further comprising a sensor configured to detect a position of the patient, wherein transmission interference suppression parameter is further determined as a function of the position.

3. The magnetic resonance tomography system as claimed in claim 2, wherein the position of the patient is determined by a position of a patient couch.

4. The magnetic resonance tomography system as claimed in claim 1, further comprising an interface configured to receive information about the property of the patient.

5. The magnetic resonance tomography system as claimed in claim 1, wherein the property of the patient is detected by way of a magnetic resonance scan for detection of the property of the patient.

6. The magnetic resonance tomography system as claimed in claim 5, wherein the magnetic resonance tomography system is configured to temporally interlace a magnetic resonance scan for image capture with the magnetic resonance scan for detection of the property of the patient.

7. The magnetic resonance tomography system as claimed in claim 1, wherein the interference suppression transmitter is configured to generate the interference suppression signal for the interference suppression antenna by phase shift and/or amplitude adjustment as a function of one or more transmission interference suppression parameters.

8. A method for operation of a magnetic resonance tomography system having an interference suppression transmitter and an interference suppression antenna arranged at a distance from a patient tunnel, the method comprising:
detecting a property of a patient by the magnetic resonance tomography system, wherein the property comprises a weight, a height or a body shape of the patient;
determining a transmission interference suppression parameter as a function of the property, so with simultaneous outputting of an interference suppression signal and an excitation pulse a field strength of the excitation pulse is reduced by destructive interference in a predetermined region of an environment of the magnetic resonance tomography system; and
outputting the excitation pulse and simultaneously outputting the interference suppression signal as a function of the transmission interference suppression parameter with the interference suppression transmitter and the interference suppression antenna.

9. The method as claimed in claim 8, wherein outputting comprises the interference suppression transmitter outputting the interference suppression signal in a frequency range of the excitation pulse of the magnetic resonance tomography system via the interference suppression antenna as a function of the transmission interference suppression parameter.

10. The method as claimed in claim 8, wherein detecting comprises detecting an input by an operator at an operating interface of the magnetic resonance tomography system.

11. The method as claimed in claim 8, wherein detecting comprises detecting with a magnetic resonance scan.

12. The method as claimed in claim 8, wherein detecting comprises evaluating a system configuration.

13. The method as claimed in claim 8, wherein detecting comprises detecting at a plurality of different instants and interpolating the property between these instants.

* * * * *